(12) United States Patent
Bryant et al.

(10) Patent No.: US 6,605,981 B2
(45) Date of Patent: Aug. 12, 2003

(54) APPARATUS FOR BIASING ULTRA-LOW VOLTAGE LOGIC CIRCUITS

(75) Inventors: Andres Bryant, Essex Junction, VT (US); Peter Edwin Cottrell, Essex Junction, VT (US); John Joseph Ellis-Monaghan, Grand Isle, VT (US); Mark B. Ketchen, Hadley, MA (US); Edward Joseph Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 38 days.

(21) Appl. No.: 09/842,544

(22) Filed: Apr. 26, 2001

(65) Prior Publication Data

US 2002/0171468 A1 Nov. 21, 2002

(51) Int. Cl.⁷ .................................................. G05F 3/02
(52) U.S. Cl. ........................................ 327/534; 327/535
(58) Field of Search ................................ 327/530, 534, 327/535

(56) References Cited

U.S. PATENT DOCUMENTS

| | | | |
|---|---|---|---|
| 5,397,934 A | | 3/1995 | Merrill et al. |
| 5,467,048 A | * | 11/1995 | Watanabe ..................... 326/69 |
| 5,689,209 A | * | 11/1997 | Williams et al. ............ 327/425 |
| 5,770,964 A | * | 6/1998 | Suma .......................... 327/327 |
| 5,811,857 A | * | 9/1998 | Assaderaghi et al. ....... 257/355 |
| 5,814,845 A | | 9/1998 | Carley |
| 5,821,769 A | * | 10/1998 | Douseki ..................... 326/121 |
| 5,874,851 A | * | 2/1999 | Shiota ........................ 327/534 |
| 5,917,365 A | | 6/1999 | Houston |
| 5,929,695 A | | 7/1999 | Chan et al. |
| 5,939,934 A | | 8/1999 | So et al. |
| 6,222,710 B1 | * | 4/2001 | Yamaguchi ................. 361/111 |
| 6,404,269 B1 | * | 6/2002 | Voldman ..................... 327/534 |
| 2001/0043112 A1 | * | 11/2001 | Voldman ..................... 327/534 |

* cited by examiner

Primary Examiner—Terry D. Cunningham
(74) Attorney, Agent, or Firm—Richard A. Henkler; Bracewell & Patterson, L.L.P.

(57) ABSTRACT

An apparatus for biasing ultra-low voltage logic circuits is disclosed. An integrated circuit device includes multiple transistors and a global body bias circuit. The global body bias circuit includes a first transistor and second transistors connected in series between a power supply and a second power supply or ground. The gate and source of the first transistor are connected to the first power supply. The gate and source of the second transistor are connected to the second power supply. The drains and bodies of the first and second transistors are connected together to form an output connected to the bodies of the other transistors within the integrated circuit device.

14 Claims, 7 Drawing Sheets

APPARATUS FOR BIASING ULTRA-LOW VOLTAGE LOGIC CIRCUITS

BACKGROUND OF THE INVENTION

1. Technical Field

The present invention relates to integrated circuit devices in general, and in particular to an apparatus for biasing logic circuits within integrated circuit devices. Still more particularly, the present invention relates to an apparatus for biasing ultra-low voltage logic circuits within an integrated circuit device.

2. Description of the Prior Art

Metal-oxide semiconductor field-effect transistors (MOSFETs) are commonly found in integrated circuit devices. A MOSFET includes a gate, a source, and a drain. The flow of charge carriers through a channel between the source and drain can be controlled by applying a voltage at the gate of a MOSFET. A depletion-mode MOSFET includes a doped or conducting channel under a gate even when no voltage is applied to the gate. An enhancement-mode MOSFET, in contrast, requires a gate-to-source bias voltage be applied in order to generate an inversion layer to serve as a conducting channel. Such bias voltage is known as a threshold voltage, $V_t$. A positive voltage between the gate and source is required to induce a strong channel for an N-channel enhancement-mode MOSFET. As for a P-channel enhancement-mode MOSFET, current flows when the gate-to-source voltage is negative below the negative threshold voltage of the P-channel enhancement-mode MOSFET.

However, even when the gate voltage is less than the threshold voltage, a current, commonly referred to as a subthreshold current, still exists within the channel and its value is given by $I_{DS}(V_{GS})=(W/L) I_0 10^{-(Vg-Vt)/s}$, where $V_{GS}$ is a gate voltage with respect to a source, $I_0$ is a constant approximately equals to 300 nA for N-channel MOSFETs and 70 nA for P-channel MOSFETs, s is the subthreshold swing ~80 mV/decade, $V_t$ is the threshold voltage, and W and L are the electrical width and length of a MOSFET, respectively.

The threshold voltage of an enhancement-mode MOSFET is determined by several intrinsic factors, such as channel length, channel width, doping, gate oxide thickness, etc. Extrinsic factors, such as ambient temperature, can also affect the threshold voltage. Furthermore, the threshold voltage is strongly influenced by the voltage applied to the substrate or well (or generally known as the body) of a MOSFET in that a more positive bias will lead to a less positive threshold voltage. If the threshold voltage of a transistor is too low, the transistor may have an unacceptable amount of leakage current when the actual supply voltage is greater than the desired supply voltage. Conversely, if the threshold voltage of a transistor is too high, then there is a reduced likelihood that the transistor will be fully turned on. Although many aspects of a semiconductor manufacturing process can be controlled, there is still a wide variation of threshold voltage values among all the many transistors within an integrated circuit device.

The switching power dissipated by complementary-metal oxide semiconductor (CMOS) circuits is given by $P_{active}=C \times V_{dd}2 \times f$, where C is the capacitance of switching nodes, $V_{dd}$ is the power supply voltage, and f is the frequency of the nodes switching. In many applications, it is desirable to reduce the switching power to either preserve power due to power supply limitations, or to reduce heating due to various cooling constraints. To this end, the switching power may be reduced by either reducing the capacitance, the frequency, or the operating voltage. Capacitance reductions are often limited by process and manufacturing constraints such as lithographic resolution and tolerances. The frequency often represents a desired output of the circuits and, as such, a reduction may prove a serious compromise to the desired end of a logic circuit. Thus, the power supply voltage remains a key variable that can allow for the reduction of active power.

Subthreshold logic, in which CMOS circuits are operated at $V_{dd} < V_t$, has been an approach used for ultra-low power CMOS circuits where speed is not critical and $V_{dd}$ can be reduced to approximately one volt. In principle, CMOS logic circuits can maintain stable operation to as low as $V_{dd}=4\eta kT/Q_e$, where h is an ideality, typically ~1.4, and is affected by process details of the MOSFETs involved, k is the Boltzmann's constant, $Q_e$ is the elementary charge of the electron, and T is the ambient temperature in Kelvin. In practice, however, CMOS logic circuits can operate at or nearby the above-mentioned limit only when the OFF currents of N-channel and P-channel MOSFETs, $I_{off}$-N and $I_{off}$-P, respectively, are very nearly equal to each other.

CMOS processing involves the use of independent doping steps for N-type and P-type MOSFETs as well as other process variables, which result in variation in the $V_t$s and in turn the $I_{off}$s of the N-type and P-type MOSFETs independent of one another. Thus, even when a process is devised to provide $I_{off}$-N=$I_{off}$-P nominally, there will be significant variations from one wafer to another which, in turn, limits the minimum $V_{dd}$ at which such logic circuits fabricated in such a process will function. Consequently, it is desirable to provide a practical means of ensuring $I_{off}$-N=$I_{off}$-P by providing appropriate N-well and substrate biases in order to allow operation of CMOS logic circuits to values of $V_{dd}$ approaching or equal to the theoretical limit of approximately $4\eta kT/Q_e$ or approximately 100 mV at room temperature. In light of such, the present disclosure describes an apparatus for providing precise threshold matching among several sub-threshold logic circuits.

SUMMARY OF THE INVENTION

It is an object of the present invention to provide an apparatus for predictably varying the $I_{off}$ ratios between N-channel and P-channel transistors for logic circuits that may accrue benefits from such condition. It is another object of the present invention to provide an apparatus for distributing the required N-well and substrate biases without using any explicit wiring or any conventional interconnect layers.

In accordance with a preferred embodiment of the present invention, an integrated circuit device includes multiple transistors and a global body bias circuit. The global body bias circuit includes a first transistor and second transistors connected in series between a power supply and a second power supply or ground. The gate and source of the first transistor are connected to the first power supply. The gate and source of the second transistor are connected to the second power supply. The drains and bodies of the first and second transistors are connected together to form an output connected to the bodies of the other transistors within the integrated circuit device.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIGS. 4a–4b are schematic diagrams of the global body bias circuit from FIG. 4 having additional input controls.

DETAILED DESCRIPTION OF A PREFERRED EMBODIMENT

In accordance with a preferred embodiment of the present invention, a global body bias circuit is utilized to match the $I_{off}$ of N-channel and P-channel transistors with each other within a logic circuit by adjusting the bias of a global N-well and a substrate (or a global P-well). $I_{off}$ is the amount of current a transistor draws from its drain when its gate is tied to its source.

Figure 1A:
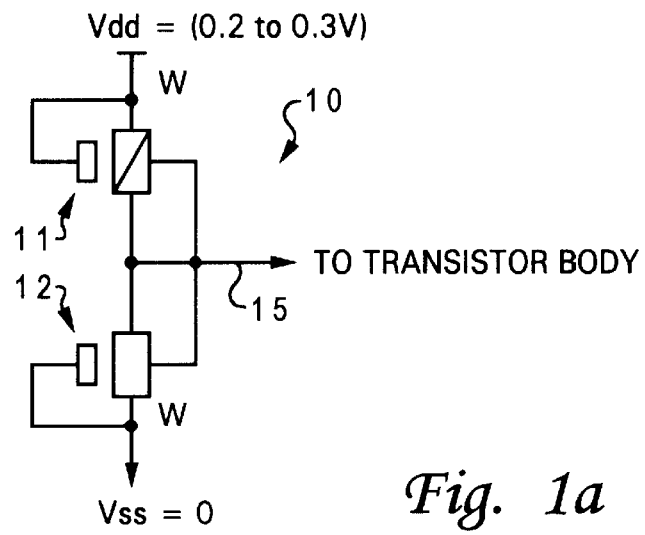
FIG. 1a is a schematic diagram of a global body bias circuit having one output, in accordance with a preferred embodiment of the present invention.

Referring now to the drawings and in particular to FIG. 1a, there is depicted a schematic diagram of a global body bias circuit having one output, in accordance with a preferred embodiment of the present invention. As shown, a global body bias circuit 10 includes a P-channel transistor 11 and an N-channel transistor 12 connected in series. The gate and source of P-channel transistor 11 are connected to a power supply $V_{dd}$ that provides a voltage ranging between 0.2 V–0.3 V. The gate and source of N-channel transistor 12 are connected to ground (or to a power supply $V_{ss}$). The bodies and the drains of P-channel transistor 11 and N-channel transistor 12 are connected together to form an output 15 for providing a body bias to other transistors within an integrated circuit device, as will be further described in an example shown in FIG. 3.

The widths of P-channel transistor 11 and N-channel transistor 12 can be in various ratios, but are preferred to be equal. Usually, to minimize power, the widths of transistors 11 and 12 are set to a minimum width allowable by the process technology in order to minimize capacitance. Since both P-channel transistor 11 and N-channel transistor 12 are gated off and the drain currents must be equal, the output voltage at output 15 can find a body bias needed to provide an equal amount of $I_{off}$ to transistors in other logic circuits.

In a process where source/drain junction leakage to wells of transistors can sometimes be higher than the amount of $I_{off}$, it may be necessary to match on subthreshold voltage on currents (i.e., $I_{DS}$ at $V_{GS}=V_{dd}-V_{ss}$) instead, which will increase the standby leakage of the global well voltage generators, but not for the logic circuits. Such is done by connecting the gate of N-channel transistor 12 from FIG. 1 to $V_{dd}$ instead of $V_{ss}$, and by connecting the gate of P-channel transistor 11 from FIG. 1 to $V_{ss}$ instead of $V_{dd}$. The result is shown in FIG. 1b.

Figure 1B:
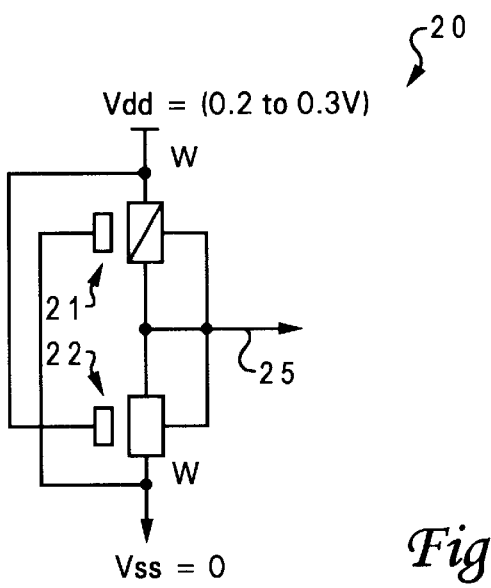
FIG. 1b is a schematic diagram of a global body bias circuit having one output, in accordance with an alternative embodiment of the present invention.

Referring now to FIG. 1b, there is depicted a schematic diagram of a global body bias circuit having one output, in accordance with an alternative embodiment of the present invention. As shown, a global body bias circuit 20 includes a P-channel transistor 21 and an N-channel transistor 22 connected in series. The source of P-channel transistor 21 and the gate of N-channel transistor 22 are connected to a power supply $V_{dd}$ that provides a voltage ranging between 0.2 V–0.3 V. The source of N-channel transistor 22 and the gate of P-channel transistor 21 are connected to ground (or to a power supply $V_{ss}$). The bodies and the drains of P-channel transistor 21 and N-channel transistor 22 are connected together to form an output 25 for providing a body bias to other transistors within an integrated circuit device.

To minimize the generator standby current, it is possible to use a voltage divider network and to tie the well voltage generator transistor gates to intermediate voltages that maintain device currents above junction leakage levels but below the maximum subthreshold voltage $I_{on}$. $I_{on}$ is the amount of current a transistor will draw from its drain when its gate is driven at full voltage.

Figure 2A:
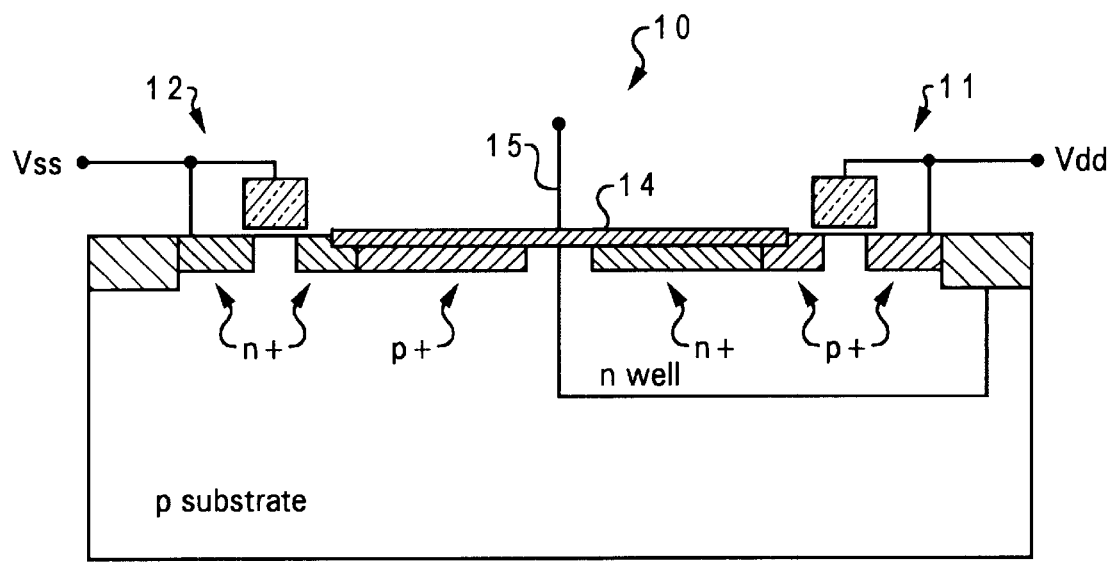
FIG. 2a is a pictorial illustration of the global body bias circuit from FIG. 1a implemented on a substrate, in accordance with a preferred embodiment of the present invention.

With reference now to FIG. 2a, there is depicted a pictorial illustration of global body bias circuit 10 implemented on a P-type substrate, in accordance with a preferred embodiment of the present invention. As shown, the body of P-channel transistor 11, which is an N-well, is connected to the body of N-channel transistor 12, which is the P-type substrate, via a silicide layer 14 to form output 15. Instead of using contacts, the connections from silicide layer 14 to the N-well and the P-substrate are preferably made by an N+ diffusion and a P+ diffusion, respectively. Such method of body connections is particularly attractive because P-channel transistor 11 and N-channel transistor 12 can all be tied locally to the P-substrate with butted junctions.

Figure 2B:
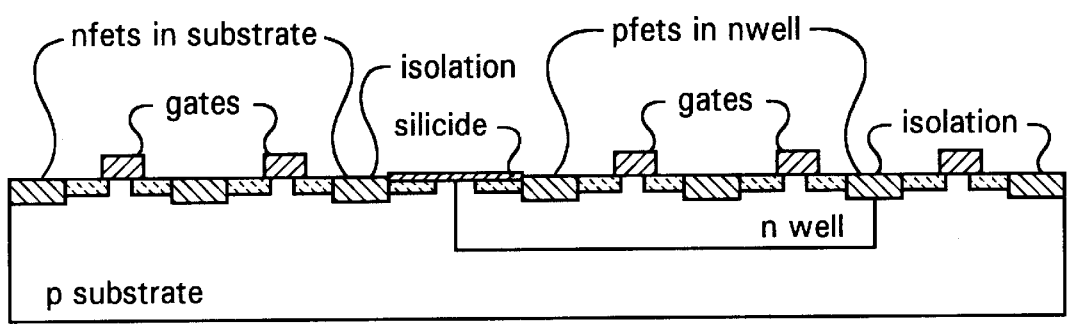
FIG. 2b is a pictorial illustration of various logic circuits that receive the global body bias circuit from FIG. 1a implemented on a substrate, in accordance with a preferred embodiment of the present invention.

Similarly, all logic circuits that receive a body bias from a global body bias circuit, such as global body bias circuit 10 from FIG. 1a may use a structure similar to the one shown in FIG. 2a. With reference now to FIG. 2b, there is depicted a pictorial illustration of various logic circuits that receive a global body bias circuit implemented on a substrate, in accordance with a preferred embodiment of the present invention. As shown, connections from a silicide layer 24 to the N-well and the P-substrate are preferably made by an N+ diffusion and a P+ diffusion, respectively. By taking advantage of a common substrate connection available to the entire integrated circuit as shown in FIGS. 2a and 2b, the need to distribute a well bias within a level of interconnect, or wiring is eliminated. As a result, a denser and cheaper integrated circuit can be obtained.

Figure 3:
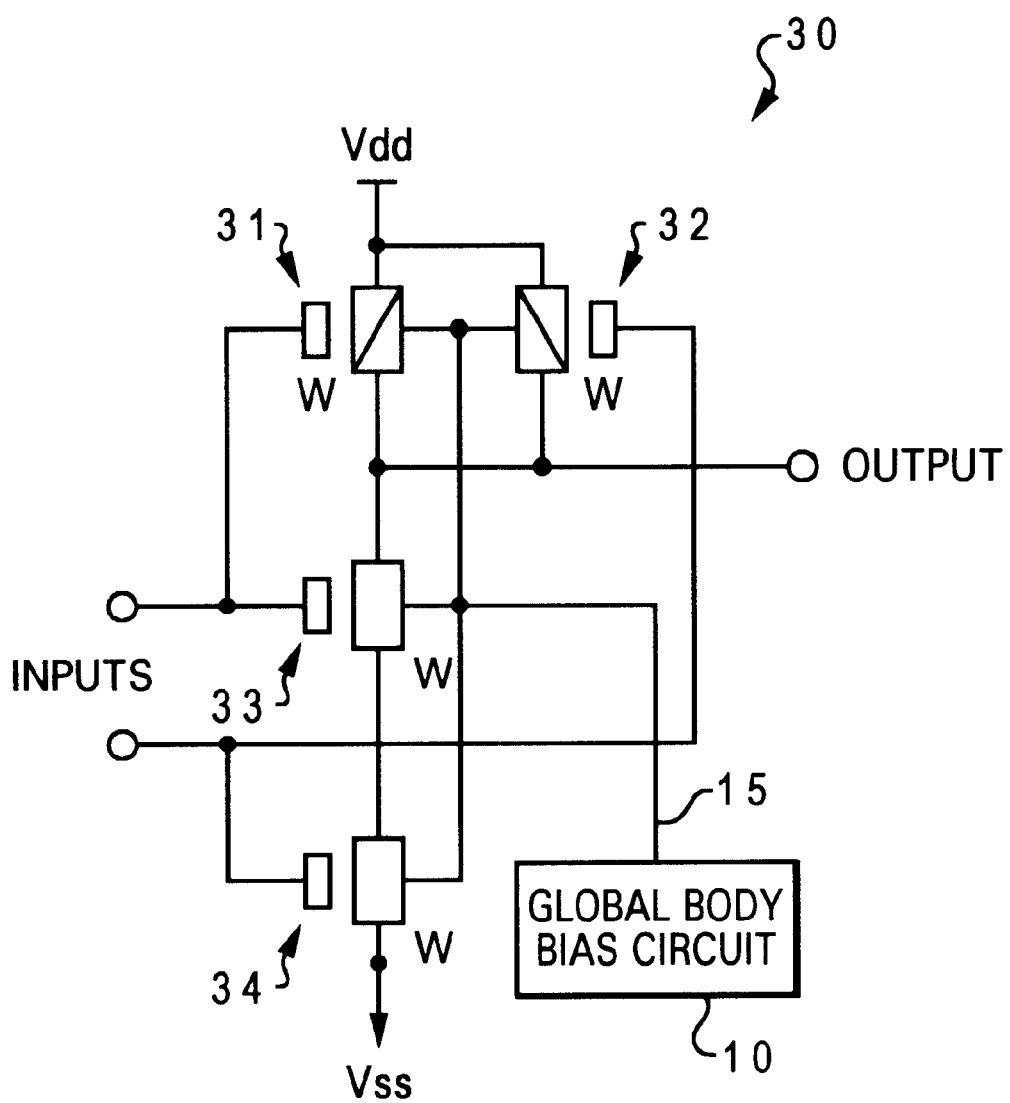
FIG. 3 is an implementation example of the global body bias circuit from FIG. 1.

Referring now to FIG. 3, there is illustrated an implementation example of global body bias circuit 10 from FIG. 1, in accordance with a preferred embodiment of the present invention. In this example, a two-input NAND gate 30 is a circuit that needs to be biased. As shown, two-input NAND gate 30 includes two P-channel transistors 31–32 and two N-channel transistors 33–34 connected in a manner that is well-known in the art. In order to provide body bias to NAND gate 30, output 15 of global body bias circuit 10 from FIG. 1 is connected to the bodies of transistors 31–34.

Figure 4:
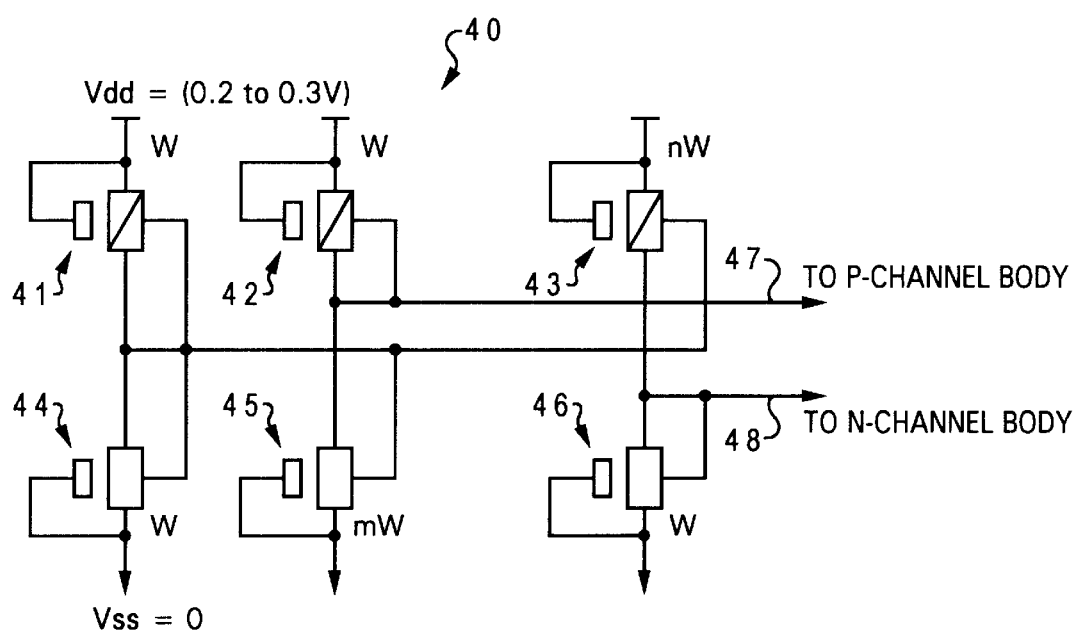
FIG. 4 is a schematic diagram of a global body bias circuit having two outputs, in accordance with a preferred embodiment of the present invention.

In order to provide more flexibility in setting transistors to a higher amount of $I_{off}$ than is capable by body bias circuit 10 from FIG. 1, a global body bias circuit having two outputs is needed. With reference now to FIG. 4, there is depicted a schematic diagram of a global body bias circuit having two outputs, in accordance with a preferred embodiment of the present invention. As shown, a global body bias circuit 40 includes P-channel transistors 41–43 and N-channel transistors 44–46. Each gate and source of P-channel transistors 41–43 are connected to a power supply $V_{dd}$ that provides a voltage ranging between 0.2 V–0.3 V. Each gate and source of N-channel transistors 44–46 are connected to ground (or a power supply $V_{ss}$). The bodies and the drains of transistors 41 and 44 are connected to the bodies of transistors 43 and 45. In addition, the body and the drain of transistor 42 are connected together to form an output 47 for providing a body bias to other P-channel transistors within an integrated circuit device. Similarly, the body and the drain of transistor 46 are connected together to form an output 48 for providing a body bias to other N-channel transistors within the same integrated circuit device, as will be further described in an example shown in FIG. 5.

Global body bias circuit 40 allows the bodies of P-channel transistors and N-channel transistors within a logic circuit to be biased independently. Global body bias circuit 40 also allows the $I_{off}$-N/$I_{off}$-P to be programmed to a set ratio such as m/n, and $I_{off}$-N is the $I_{off}$ of N-channel transistors, and $I_{off}$-P is the $I_{off}$ of P-channel transistors. Thus, $I_{off}$-N/$I_{off}$-P can be increased by choosing m and n as large as they are desired. The arrangement of global body bias circuit 40 allows a higher performance circuit to be programmed at the expense of higher standby power when appropriate. With global body bias circuit 40, isolate P-wells as well as N-wells are required. The required P-wells and N-wells may be provided by using either silicon-on-insulator (SOI) technology with body contacts or triple well technology.

Since global body bias circuit 40 requires explicit wiring to at least N-wells (because N-wells and P-wells are independent from each other), global body bias circuit 40 is simple enough (and hence small enough) to be scattered liberally throughout a product design, which may lessen the wiring penalty for the well bias. Furthermore, different circuit blocks may now have their drive current locally enhanced or depressed to tune performance as needed to keep in time with other circuit blocks.

Figure 4A:
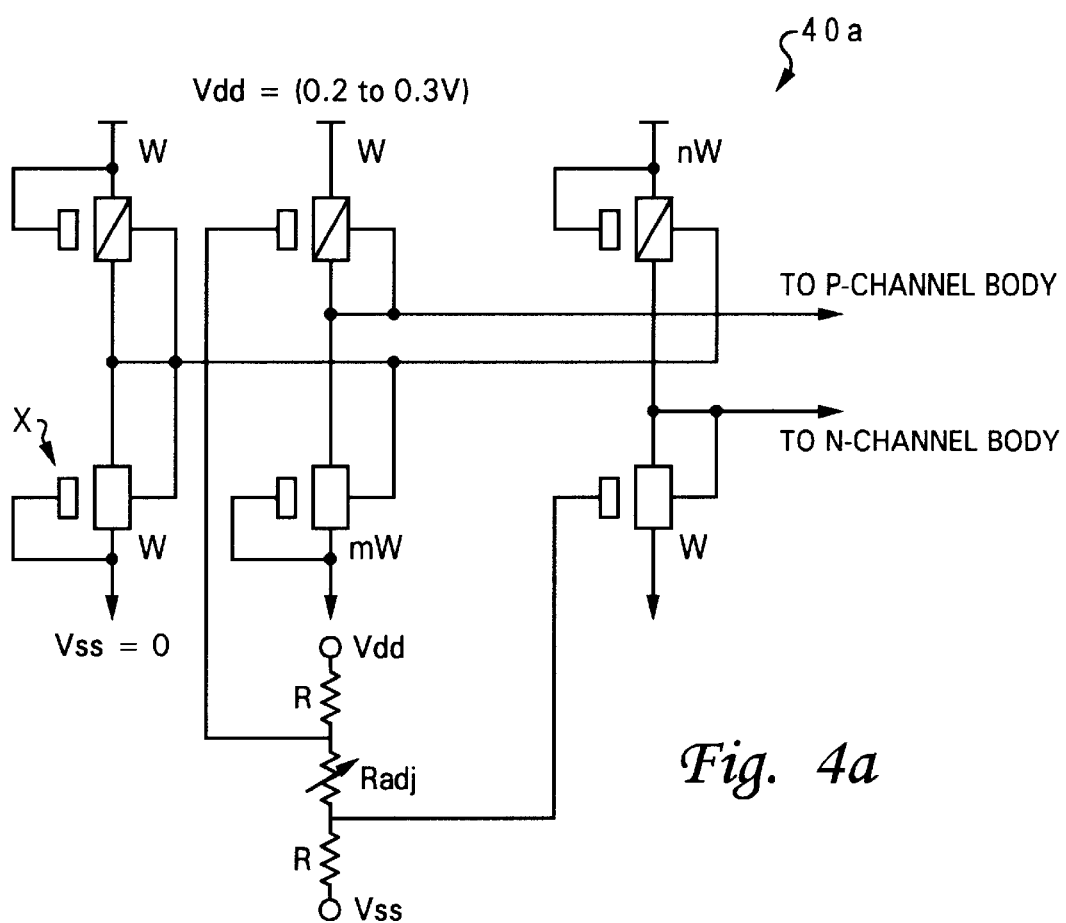
Figure 46:
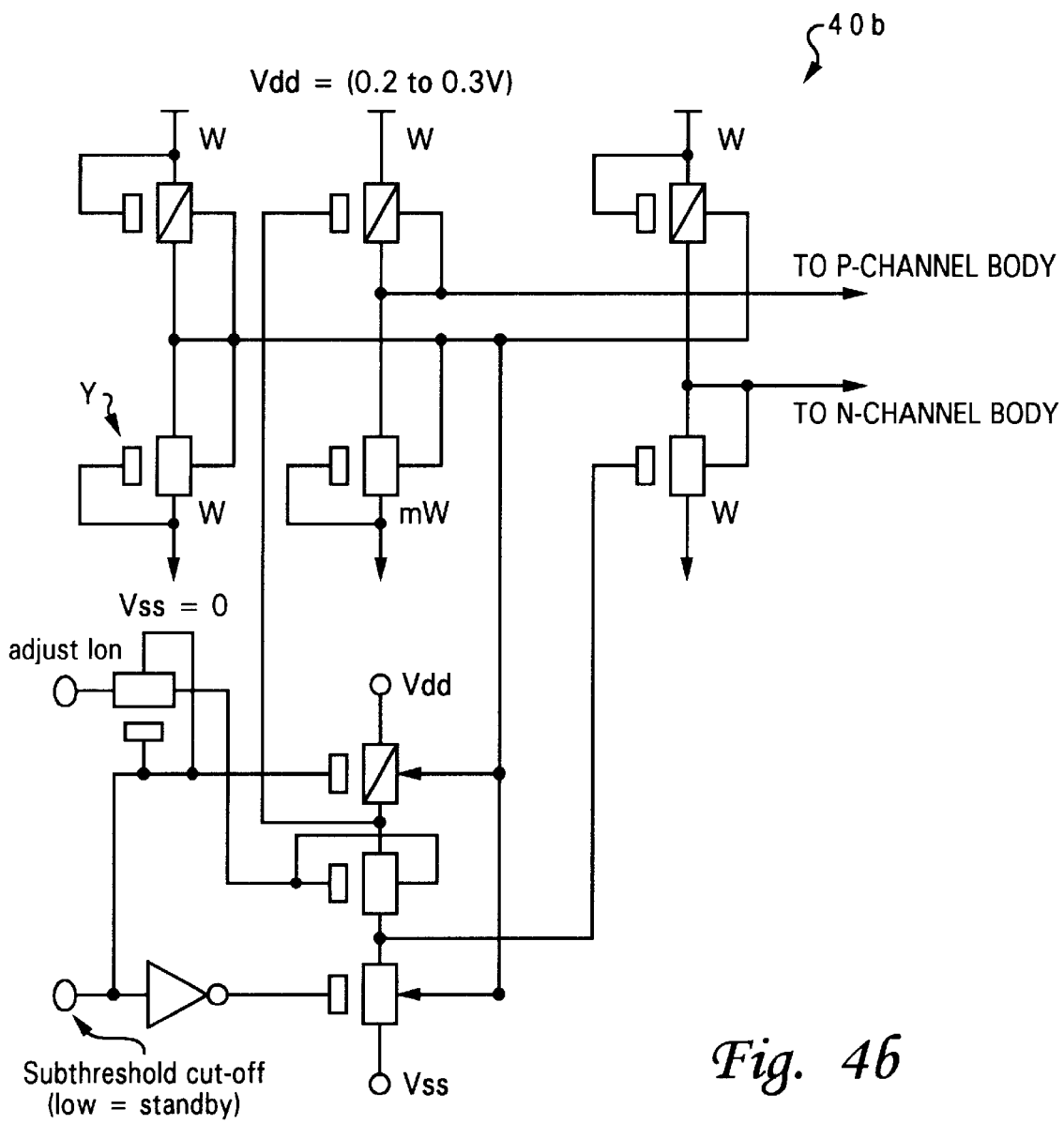

Variations of global body bias circuit 40 are separately illustrated in FIGS. 4a and 4b. A global body bias circuit 40a in FIG. 4a allows the amount of $I_{off}$ to be continuously varied with $R_{adj}$ while $I_{off}$-N and $I_{off}$-P are kept at a fixed ratio of n/m. Thus, if $R_{adj}$ is replaced by a transistor, the performance and standby power of global body bias circuit 40a can be modulated "on the fly." Global body bias circuit 40a sets N-channel transistors at $$I_{off}N = nI_{off\_x}e^{\frac{V_{dd}R}{(2R+R_{adj})Se}}$$

and P-channel transistors at $$I_{off}P = mI_{off\_x}e^{\frac{V_{dd}R}{(2R+R_{adj})Se}}$$

where Se=$\eta kT/Q_e$ and $I_{off\_x}$ is the drain current of an N-channel transistor x.

A global body bias circuit 40b in FIG. 4b has an enable body cut-off of subthreshold leakage during inactive periods. Global body bias circuit 40b sets N-channel transistors at $$I_{off}N = nI_{off\_y}e^{\frac{V_{dd}R}{(2R+R_{adj})Se}}$$

and P-channel transistors at $$I_{off}P = mI_{off\_y}e^{\frac{V_{dd}R}{(2R+R_{adj})Se}}$$

where Se=$\eta kT/Q_e$ and $I_{off\_y}$ is the drain current of an N-channel transistor y and $R_n$ and $R_p$ are the effective source-to-drain resistances of N-channel $T_n$ and P-channel transistor $T_p$, respectively, and $R_m$ is the effective source-to-drain resistance of N-channel transistor $T_m$, in FIG. 4b.

Figure 5:
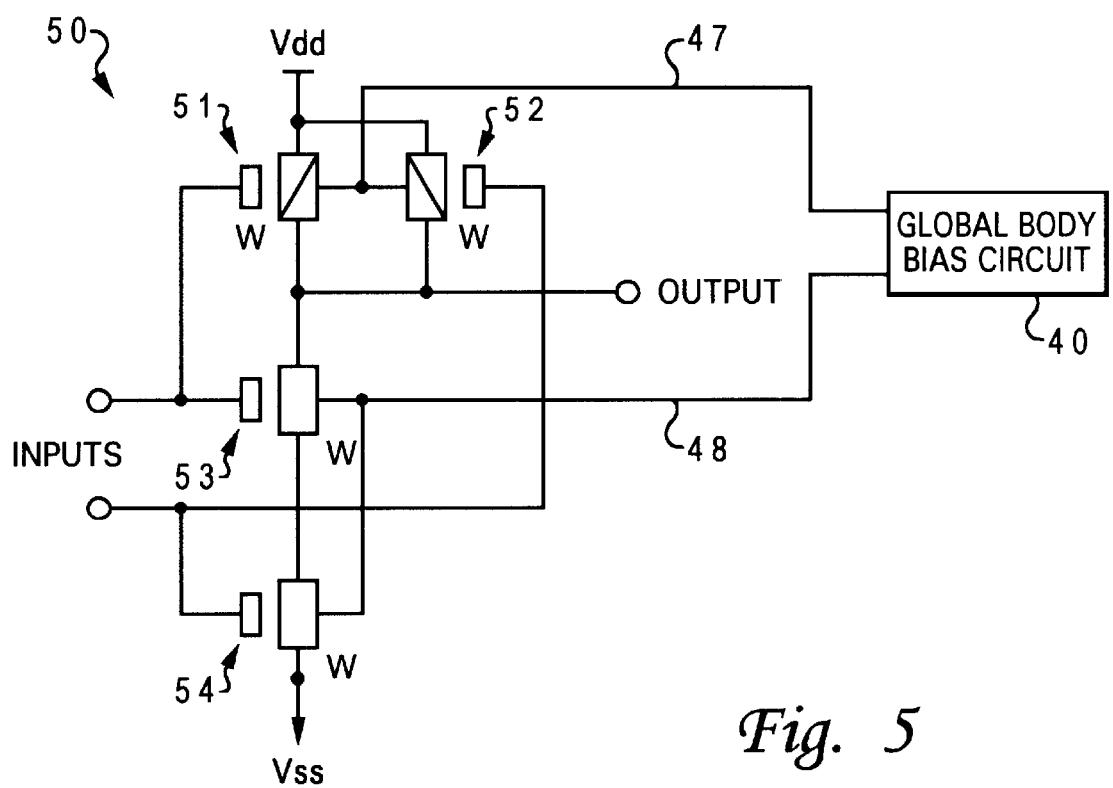
FIG. 5 is an implementation example of the global body bias circuit from FIG. 4.

Referring now to FIG. 5, there is illustrated an implementation example of global body bias circuit 40 from FIG. 4, in accordance with a preferred embodiment of the present invention. In this example, a two-input NAND gate 50 is a circuit that needs to be biased. As shown, two-input NAND gate 50 includes two P-channel transistors 51–52 and two N-channel transistors 53–54 connected in a manner that is well-known in the art. In order to provide body bias to NAND gate 50, output 47 of global body bias circuit 40 from FIG. 4 is connected to the bodies of P-channel transistors 51–52, while output 48 of global body bias circuit 40 is connected to the bodies of N-channel transistors 53–54.

As has been described, the present invention provides an apparatus for biasing ultra-low voltage logic circuits within an integrated circuit.

While the invention has been particularly shown and described with reference to a preferred embodiment, it will be understood by those skilled in the art that various changes in form and detail may be made therein without departing from the spirit and scope of the invention.

What is claimed is:

1. An integrated circuit device comprising:
   a plurality of transistors; and
   a global body bias circuit having an output connected to the bodies of said plurality of transistors, wherein said global body bias circuit includes a first and second transistors connected in series between a first power supply and a second power supply, wherein a gate and a source of said first transistor are connected to said first power supply, wherein a gate and a source of said second transistor are connected to said second power supply, wherein drains and bodies of said first and second transistors are connected together to form said output.

2. The integrated circuit device of claim 1, wherein said first transistor is a P-channel transistor and said second transistor is an N-channel transistor.

3. The integrated circuit device of claim 1, wherein said first power supply provides voltages in the range of approximately 0.2 V to 0.3 V.

4. The integrated circuit device of claim 1, wherein said second power supply provides 0 V.

5. The integrated circuit device of claim 1, wherein widths of said first and second transistors are identical.

6. The integrated circuit device of claim 1, wherein said drains of said first and second transistors are connected together via a silicide layer.

7. An integrated circuit device comprising:
   a plurality of transistors; and
   a global body bias circuit having a first output and a second output, wherein each of said first output and said second output is connected to a corresponding one of said plurality of transistors, wherein said global body bias circuit includes a first transistor and second transistors connected in series between a first power supply and a second power supply, wherein a gate and a source of said first transistor are connected to said first power supply, wherein a gate and a source of said second transistor are connected to said second power supply, wherein drains and bodies of said first and second transistors are connected together for biasing bodies of a third transistor and a fourth transistor of said global body bias circuit, wherein gates of said third and said fourth transistors are connected to said first power supply and said second power supply, respectively.

8. The integrated circuit device of claim 7, wherein said first transistor is a P-channel transistor and said second transistor is an N-channel transistor.

9. The integrated circuit device of claim 7, wherein said third transistor is a P-channel transistor and said fourth transistor is an N-channel transistor.

10. The integrated circuit device of claim 7, wherein said third transistor is of a second width.

11. The integrated circuit device of claim 7, wherein said power supply provides voltages in the range of approximately 0.2 V to 0.3 V.

12. The integrated circuit device of claim 7, wherein said second power supply provides 0 V.

13. The integrated circuit device of claim 7, wherein widths of said first and second transistors are identical.

14. The integrated circuit device of claim 7, wherein said drains of said first and second transistors are connected together via a silicide layer.

* * * * *